United States Patent
Kokubun et al.

(10) Patent No.: US 7,358,946 B2
(45) Date of Patent: Apr. 15, 2008

(54) OFFSET CANCEL CIRCUIT OF VOLTAGE FOLLOWER EQUIPPED WITH OPERATIONAL AMPLIFIER

(75) Inventors: Masatoshi Kokubun, Kawasaki (JP); Shinya Udo, Kawasaki (JP); Chikara Tsuchiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 444 days.

(21) Appl. No.: 11/181,774

(22) Filed: Jul. 15, 2005

(65) Prior Publication Data
US 2005/0270264 A1   Dec. 8, 2005

Related U.S. Application Data

(62) Division of application No. 10/301,649, filed on Nov. 22, 2002, now Pat. No. 6,946,905.

(30) Foreign Application Priority Data
Nov. 30, 2001 (JP) .............................. 2001-367832

(51) Int. Cl.
*G09G 3/36* (2006.01)
(52) U.S. Cl. .......................................... 345/87; 345/98
(58) Field of Classification Search .......... 345/87–100, 345/204; 330/9, 51, 233, 258, 288; 327/307, 327/337
See application file for complete search history.

(56) References Cited
U.S. PATENT DOCUMENTS 6,281,730 B1 *  8/2001  Vu ............................... 327/170
6,448,836 B2 *  9/2002  Kokubun et al. ........... 327/307
6,580,408 B1 *  6/2003  Bae et al. ...................... 345/76
6,586,990 B2 *  7/2003  Udo et al. ...................... 330/9
6,756,842 B2 *  6/2004  Mehr et al. .................... 330/9
6,943,780 B1 *  9/2005  Van Dijk ..................... 345/204
7,098,877 B2 *  8/2006  Sakamoto et al. ............ 345/82

FOREIGN PATENT DOCUMENTS

JP   2001-292041   10/2001

* cited by examiner

*Primary Examiner*—Nitin I. Patel
(74) *Attorney, Agent, or Firm*—Arent Fox LLP

(57) ABSTRACT

A differential amplifying circuit 11 includes a current mirror circuit having first and second current ends to which drains of MOS transistors M8 and M9 are respectively connected, and a pair of differential MOS transistors M1 and M2 having gates between which a switch SW1 is connected. A reference potential Vref is applied to the gate of the MOS transistors M9. A switch SW2 is connected between the output VO of an output buffer circuit 12 and the gate of a MOS transistor M1, and a switch SW3 is connected between the output VO and the gate of the MOS transistor M8. During the offset-cancel preparation period, the switches SW1 and SW3 are on and the switch SW2 is off. Next, the switches SW1 to SW3 are turned over, consequently outputting offset-canceled potential VO.

6 Claims, 9 Drawing Sheets

OFFSET CANCEL CIRCUIT OF VOLTAGE FOLLOWER EQUIPPED WITH OPERATIONAL AMPLIFIER

This is a Division of application Ser. No. 10/301,649 filed Nov. 22, 2002 now U.S. Pat. No. 6,946,905. The disclosure of the prior application is hereby incorporated by reference herein in its entirety.

BACKGROUND OF THE INVENTION

1. Field of the Invention

The present invention generally relates to an offset cancel circuit of a voltage follower equipped with an operational amplifier, and more specifically to a voltage follower suitably applied to the output stage of a data driver for a liquid crystal display device that frequently carries out the offset cancel, an offset cancel circuit thereof, and a data driver, for a liquid crystal display device, employing the voltage follower in the output stage thereof.

2. Description of the Related Art

FIG. 8 is a circuit diagram showing a prior art voltage follower with offset-cancel disclosed in JP 2001-292041-A.

An operational amplifier 10 comprises a differential amplifying circuit 11 and an output buffer circuit 12 connected to a subsequent stage thereof, and is used as a voltage follower whose amplification factor is 1, by feeding back the output potential VO of the output buffer circuit 12 to the gate of an NMOS transistor M1 as an inverting input of the differential amplifying circuit 11. The input potential VI of the voltage follower is provided to the gate of an NMOS transistor M2 as a non-inverting input. In an ideal case, the relation of VO=VI holds by the feedback control, with the drain potentials V1 and V2 of PMOS transistors M4 and M5 as the loads of the differential amplifying circuit 11 being equal to each other.

However, the potentials V1 and V2 become not equal to each other due to variations in the thickness of the gate oxide layer of MOS transistor, causing an offset in which the output potential VO differs from the input potential VI.

In order to cancel the offset, an offset cancel circuit 13 is connected to the operational amplifier 10.

FIG. 9 is a time chart showing the operation of the circuit of FIG. 8.

During an offset cancel preparation period from a time t1 to a time t2, switches SW1 and SW3 are on, while a switch SW2 is off. Thereby, the output potential VO is not fed back to the gate of the NMOS transistor M1, and both the gate potentials of the NMOS transistors M1 and M2 are equal to the input potential V1. Therefore, the differential input circuit 15 operates as a current source for the current mirror circuit 14.

On the other hand, the input potential V1 is provided to the gate of an NMOS transistor M9, and the output potential VO is fed back to the gate of an NMOS transistor M8. Therefore, a voltage follower circuit is configured with the output buffer circuit 12 and a differential amplifying circuit that includes the current mirror circuit 14 and a differential input circuit 16, and thereby the output potential VO is feedback-controlled so as to become close to the input potential VI.

In this case, when, for example, "V1>V2" is also caused because of the above-mentioned reason, the internal resistance of the PMOS transistor M6 becomes lower than that of the ideal case, causing the output potential VO to be larger than the input potential VI. This causes the drain current of the NMOS transistor M8 to be larger than that of the NMOS transistor M9. A capacitor C1 is charged or discharged with the output potential VO, and the potential of its one electrode on the switch SW3 side becomes equal to the output potential VO.

The switches SW1 to SW3 are turned over at the time t2, whereby the operations of the differential input circuits 15 and 16 change over to each other, a voltage follower is configured with the differential amplifying circuit 11 and the output buffer circuit 12, and the output potential VO is feedback-controlled so as to become close to the input potential VI. Here, because the gate potential of the NMOS transistor M8 is equal to the output potential VO at the time t2, the gate potential of the NMOS transistor M1 is feedback-controlled to be equal to the input potential VI. Namely, VO=VI is achieved, canceling the offset voltage.

In a case where the circuit of FIG. 8 is employed for a data driver of a liquid crystal display device, the input potential VI varies in a cycle of one horizontal scan period, for example, 22 μs.

The input potential VI depends on the display data, and there is a case where it changes from the minimum value to the maximum value or from the maximum value to the minimum value. In design, taking into consideration this worst case, a feedback-control time required to stabilize the output potential VO must be secured as an offset cancel preparation time. For this reason, as the number of display lines of a liquid crystal display device becomes larger, the time (driving time) to charge and discharge the capacitances of liquid crystal pixels with the output potential VO becomes shorter, leading to failure in driving of the pixels.

SUMMARY OF THE INVENTION

Accordingly, it is an object of the present invention to provide an offset cancel circuit of a voltage follower equipped with an operational amplifier capable of reducing an offset cancel preparation time.

In one aspect of the present invention, there is provided an offset cancel circuit for a voltage follower to cancel an offset voltage of the voltage follower, the voltage follower including a differential amplifying circuit having a current mirror circuit as a load and an output buffer circuit subsequent to the differential amplifying circuit, the current mirror circuit having first and second current ends, the offset cancel circuit comprising:

a differential input circuit including first and second transistors, the first transistor having a current-path whose one end is connected to the first current end and having a gate, the second transistor having a current-path whose one end is connected to the second current end and having a gate receiving a reference potential;

a first switch connected between an inverting input and a non-inverting input of the differential amplifying circuit;

a second switch connected between the inverting input and an output of the output buffer circuit, the second switch being on/off-controlled adversely to the first switch;

a third switch connected between the output of the output buffer circuit and the gate of the first transistor, the third switch being on/off-controlled in gang with the first switch; and a capacitor connected between the gate of the first transistor and a predetermined potential.

In this configuration, during an offset-cancel preparation period, the first and third switches are held on and the second switch is held off. Thereby, the differential input circuit of the differential amplifying circuit operates as a current source for the current mirror circuit. On the other hand, because the output potential of the output buffer circuit is not fed back to the inverting input, but to the gate of the first transistor, a voltage follower circuit is configured with the output buffer circuit and a differential amplifying circuit that comprises the current mirror circuit and the differential input circuit included in the offset cancel circuit, and a feedback control is made so that the output potential becomes close to the reference potential.

After the feedback control is stabilized, the first to third switches are turned over, whereby the operations of the two differential input circuits change over to each other so that a voltage follower is configured with the differential amplifying circuit and the output buffer circuit to cause the output potential to become close to the input potential by feedback-control. Here, the capacitor makes the gate potential of the first transistor equal to the output potential at a time right before the turning over of the switches.

Even when the operations of the two differential input circuits change over to each other, since they are connected in parallel to the current mirror, and the gate potentials of the first and second transistors and the non-inverting input potential of the voltage follower are equal to the respective potentials in stabilized state at the time right before the turning over of the switches, the feedback control is stabilized with the inverting input potential of the voltage follower being equal to the non-inverting input potential at the time right before the turning over of the switches. Consequently, the offset voltage is canceled.

Other aspects, objects, and the advantages of the present invention will become apparent from the following detailed description taken in connection with the accompanying drawings.

DESCRIPTION OF THE PREFERRED EMBODIMENTS

Figure 1:
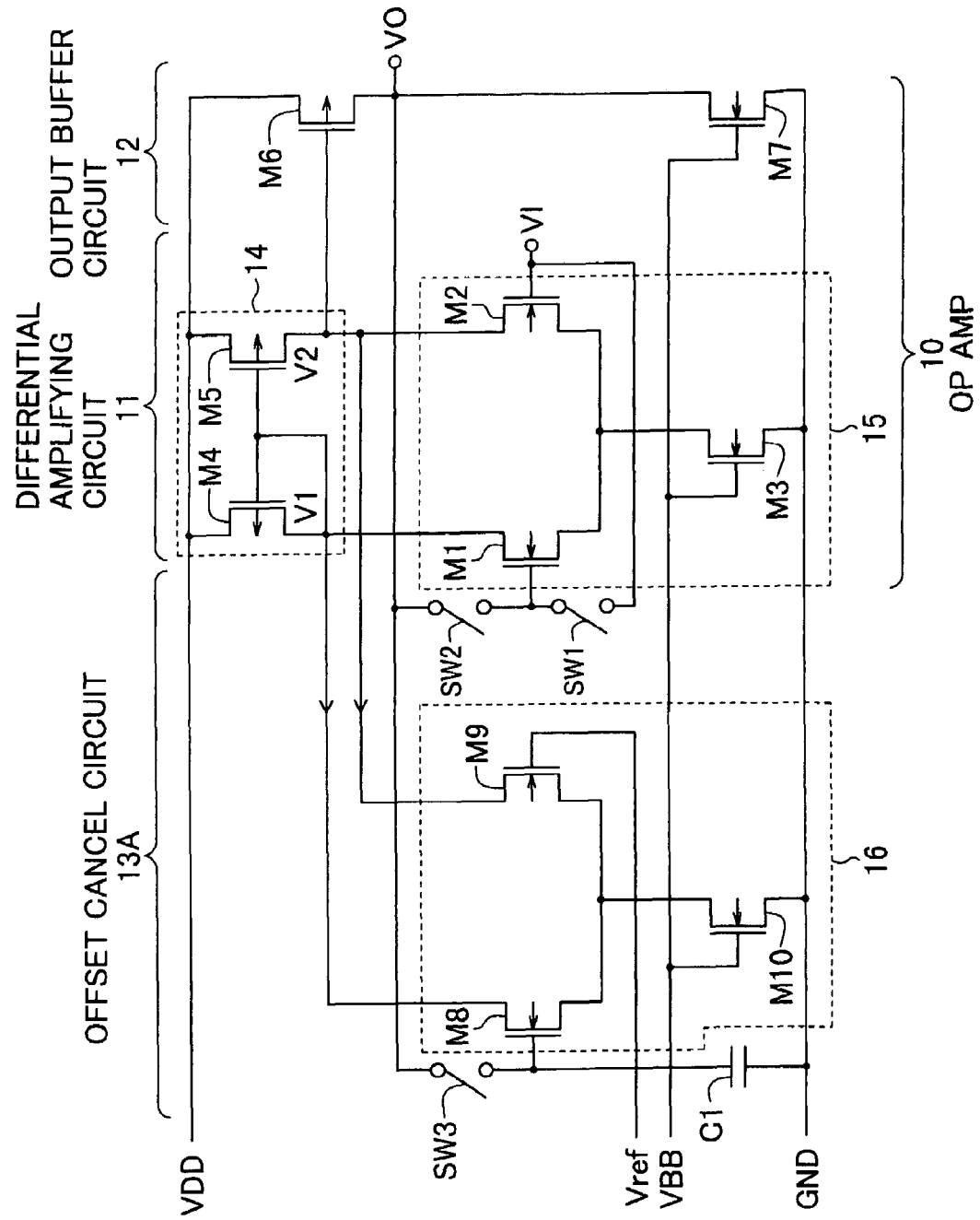
FIG. 1 is a circuit diagram showing a voltage follower with offset-cancel according to a first embodiment of the present invention.

Referring now to the drawings, wherein like reference characters designate like or corresponding parts throughout several views, preferred embodiments of the present invention are described below.

First Embodiment

FIG. 1 is a circuit diagram showing a voltage follower with offset-cancel according to a first embodiment of the present invention.

A differential amplifying circuit 11 comprises a current mirror circuit 14 as a load, and a differential input circuit 15 connected to first and second current outputs of the current mirror circuit 14.

In the current mirror circuit 14, sources of PMOS transistors M4 and M5 are connected to a power supply potential VDD, gates of the PMOS transistors M4 and M5 are connected to the drain of the PMOS transistor M4, and the drains of the PMOS transistors M4 and M5 are the first and second current outputs, respectively. In the differential input circuit 15, the sources of NMOS transistors M1 and M2 are commonly connected to the drain of an NMOS transistor M3, and the source of the NMOS transistor M3 is connected to ground GND. The NMOS transistor M3 receives a bias potential VBB at its gate and serves as a constant current source.

The inverting and non-inverting inputs of the differential amplifying circuit 11 are the gates of the NMOS transistors M1 and M2, respectively, and the output of the differential amplifying circuit 11 is the drain of the PMOS transistor M5.

An output buffer circuit 12 comprises PMOS transistors M6 and M7 that are connected in series between the power supply potential VDD and ground GND, and the NMOS transistor M7 receives the bias potential VBB at its gate and serves as a constant current source. The input and output of the output buffer circuit 12 are the gate and drain, respectively, of the PMOS transistor M6, and this input is connected to the output of the differential amplifying circuit 11.

An offset cancel circuit 13A includes a differential input circuit 16 having the same structure as the differential input circuit 15, and NMOS transistors M8 to M10 thereof correspond to NMOS transistors M1 to M3, respectively, of the differential input circuit 15. The differential input circuit 16 is connected in parallel to the differential input circuit 15 with respect to the current mirror circuit 14. The offset cancel circuit 13A further includes switches SW1 to SW3, and a capacitor C1 connected between the gate of the NMOS transistor M8 and ground GND. The switch SW1 is connected between the gates of the NMOS transistors M1 and M2, the switch SW2 is connected between the gate of the NMOS transistor M1 and the output potential VO, and the switch SW3 is connected between the gate of the NMOS transistor M8 and the output potential VO.

Figure 8:
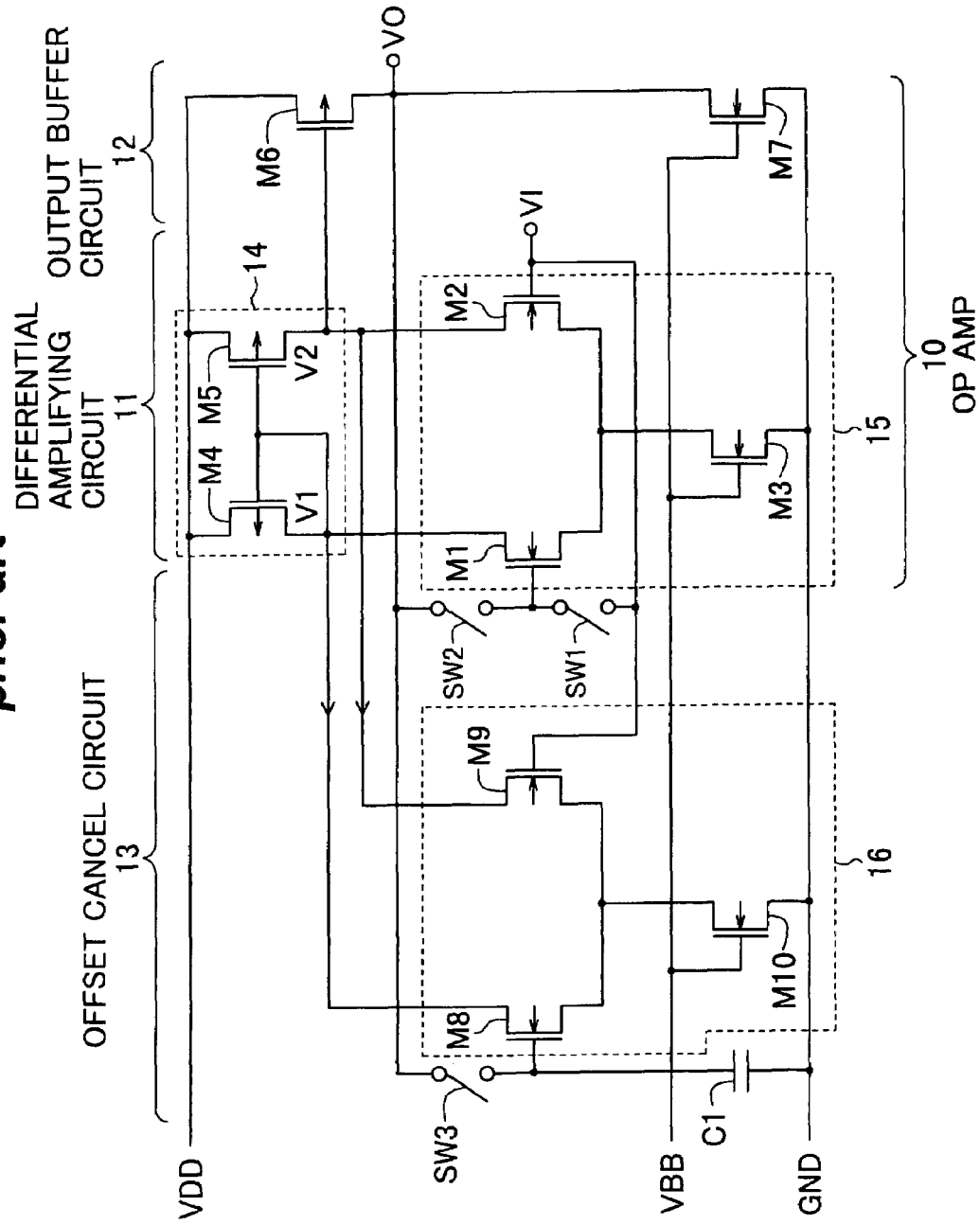
FIG. 8 is a circuit diagram showing a prior art voltage follower with offset-cancel.
Figure 9:
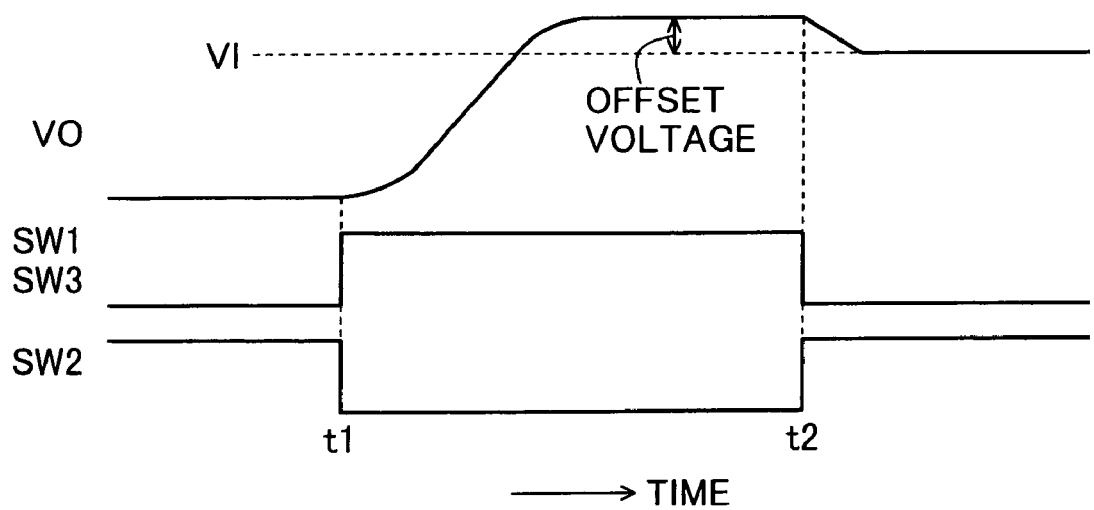
FIG. 9 is a time chart showing a prior art operation of the circuit of FIG. 8.

This circuit of FIG. 1 differs from the circuit of FIG. 8 in that instead of the input potential VI, a predetermined reference potential Vref is applied to the gate of an NMOS transistor M9.

In order to perform the offset cancel more accurately, it is preferable that there is a small difference between the reference potential Vref and the input potential VI, and the reference potential Vref is fixed to, for example, about a central point in the range of the variation of the input potential VI. For example, in a case where the circuit of FIG. 1 is employed as an output stage of a data driver for a liquid crystal display device, the reference potential Vref is set to about the central value in the gray-scale potential range.

Now, a description will be given of the operation of the above-mentioned configuration according to the first embodiment.

Figure 2:
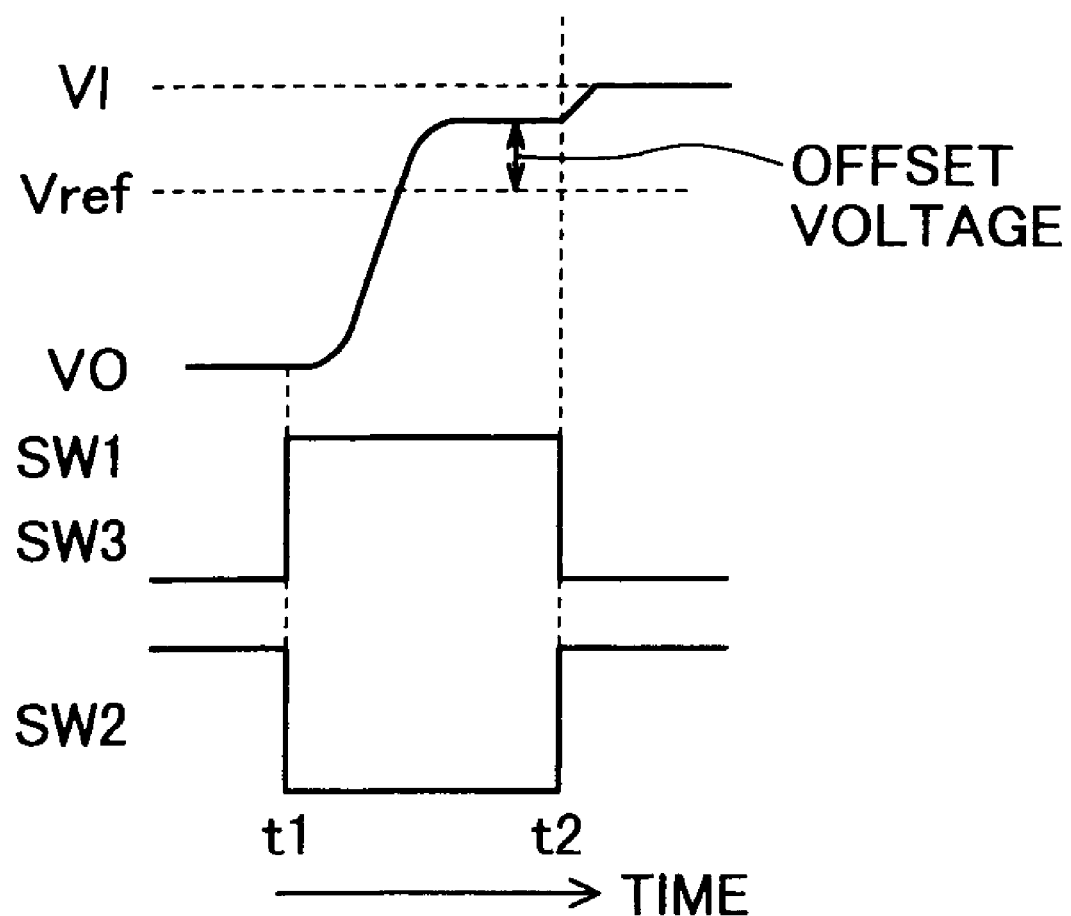
FIG. 2 is a time chart showing the operation of the circuit of FIG. 1.

FIG. 2 is a time chart showing the operation of the circuit of FIG. 1.

During an offset cancel preparation period from a time t1 to a time t2, the switches SW1 and SW3 are on, while the switch SW2 is off. Thereby, the output potential VO is not fed back to the gate of the NMOS transistor M1, and both the gate potentials of the NMOS transistors M1 and M2 are equal to the input potential V1. Therefore, the differential input circuit 15 operates as a current source for the current mirror circuit 14.

On the other hand, because the output potential VO is fed back to the gate of the NMOS transistor M8, a voltage follower circuit is configured with the output buffer circuit 12 and a differential amplifying circuit consisting of the current mirror circuit 14 and the differential input circuit 16, and the output potential VO is feedback-controlled so as to become close to the input potential VI. Here, the potentials V1 and V2 become not equal to each other due to variation in the thickness of the gate oxide layer of MOS transistor to cause an offset in which the output potential VO differs from the input potential VI.

For example, when V1>V2, the internal resistance of the PMOS transistor M6 becomes lower than that of the ideal case, causing the output potential VO to be larger than the reference potential Vref. This causes the drain current of the NMOS transistor M8 to be larger than that of the NMOS transistor M9. The capacitor C1 is charged or discharged with the output potential VO, and the potential of its one electrode on the switch SW3 side becomes equal to the output potential VO.

The switches SW1 to SW3 are turned over at the time t2, whereby the operations of the differential input circuits 15 and 16 change over to each other, a voltage follower is configured with the differential amplifying circuit 11 and the output buffer circuit 12, and the output potential VO is feedback-controlled so as to become close to the input potential VI. Even if the operations of the differential input circuits 15 and 16 change over to each other, since the differential input circuits 15 and 16 are connected in parallel to the current mirror circuit 14, and the gate potentials of the NMOS transistors M2, M8, and M9 are equal to respective those in the stable state right before turning over of the switches at the time t2, the feedback control is stabilized with the gate potential of the NMOS transistor M1 being equal to the input potential VI at a time right before the turning over of the switches. That is, VO=VI is achieved by canceling the offset voltage.

In the circuit of FIG. 8, the gate potential of the NMOS transistor M9 varies depending on the input potential VI. In contrast, in the first embodiment, because the gate potential of the NMOS transistor M9 is fixed to the reference potential Vref, the potential of the electrode, on the side of the switch SW3, of the capacitor C1 is always around the reference potential Vref, and during the offset-cancel preparation period, the time taken to reach the stabilization of the feedback control on the voltage follower circuit including the differential input circuit 16 is more shortened than in the case of FIG. 8. This time depends on the current consumption of the circuit of FIG. 1 that is the sum value of the currents flowing through the NMOS transistors M10, M3, and M7.

The experiment result showed that in a case where the capacitor C1 was 1.2 pF, and the current values flowing through the NMOS transistors M10, M3, and M7 were 5 µA, 5 µA, and 10 µA, respectively, the offset-cancel preparation time needed in the circuit of FIG. 1 was 0.6 µs. On the other hand, in the case of FIG. 8, it was 2.0 µs. In addition, in both cases of employing the circuits of FIG. 1 and FIG. 8 for a data driver of a liquid crystal display device of 64-level gray scale, the maximum value of the offset voltage was ±10 mV, while the offset cancel operation allowed it to be reduced under ±1 mV.

Figure 3:
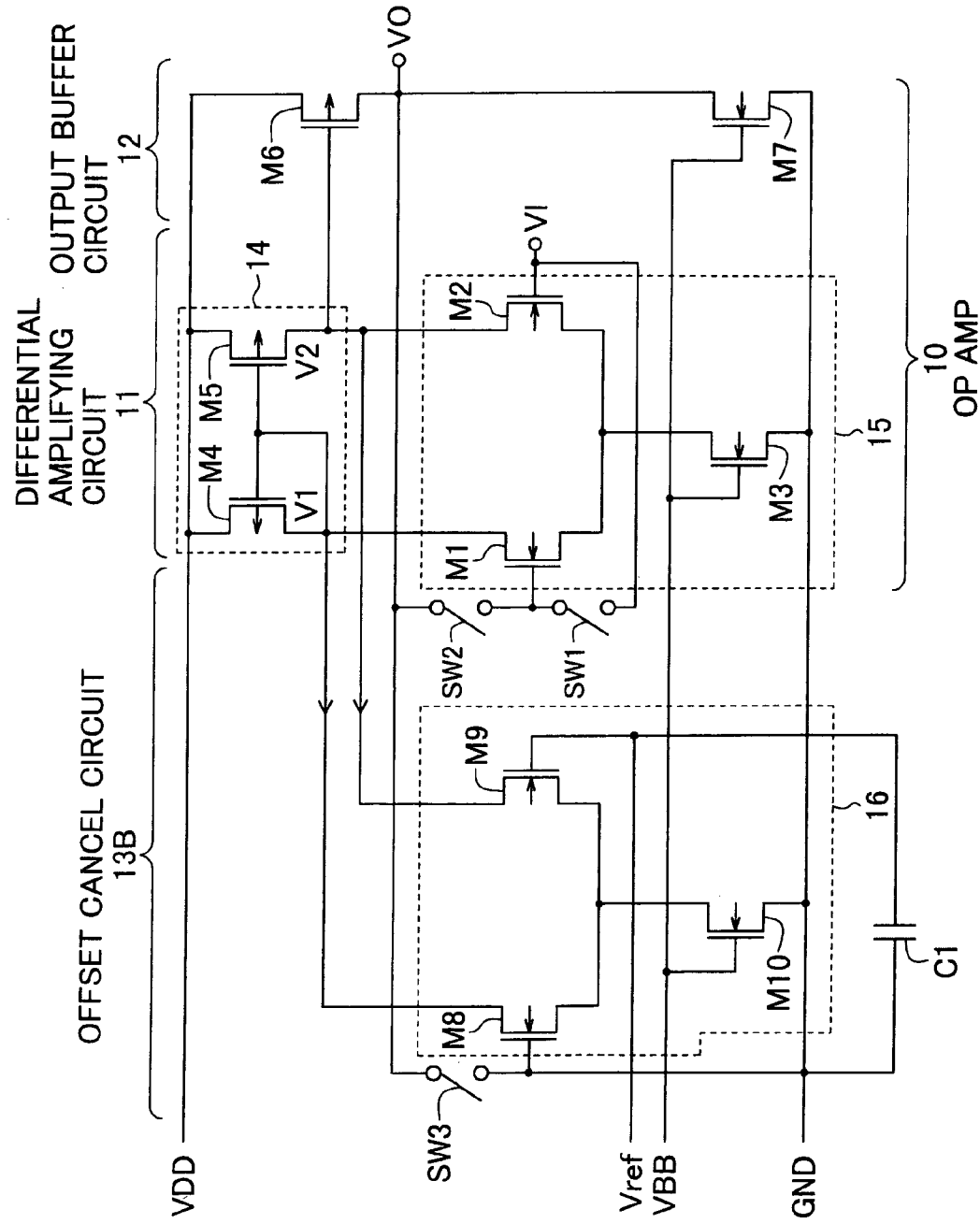
FIG. 3 is a circuit diagram showing a modification of the voltage follower with offset-cancel of FIG. 1.

FIG. 3 is a circuit diagram showing a modification of the voltage follower with offset-cancel of FIG. 1.

This circuit differs from the circuit of FIG. 1 in that the reference potential Vref is applied to the fixed-potential-side electrode of the capacitor C1. In a case where the reference potential Vref is more stable than ground GND, this circuit allows performing the offset cancel more accurately than the circuit of FIG. 1.

Figure 4:
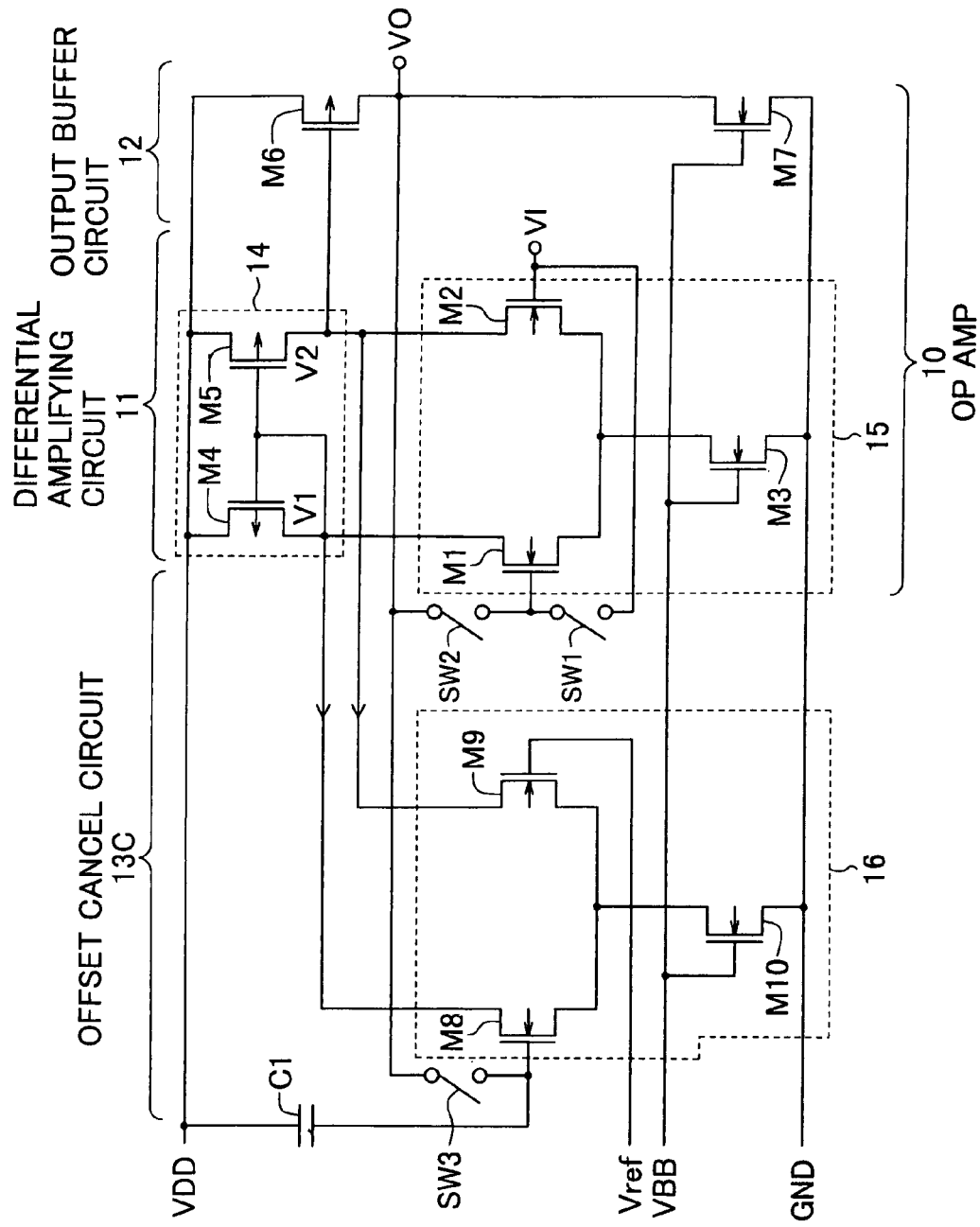
FIG. 4 is a circuit diagram showing another modification of the voltage follower with offset-cancel of FIG. 1.

FIG. 4 is a circuit diagram showing another modification of the voltage follower with offset-cancel of FIG. 1.

This circuit differs from the circuit of FIG. 1 in that the power supply potential VDD is applied to the fixed-potential-side electrode of the capacitor C1. In a case where the power supply potential VDD is more stable than ground GND, this circuit allows performing the offset cancel more accurately than the circuit of FIG. 1.

Figure 5:
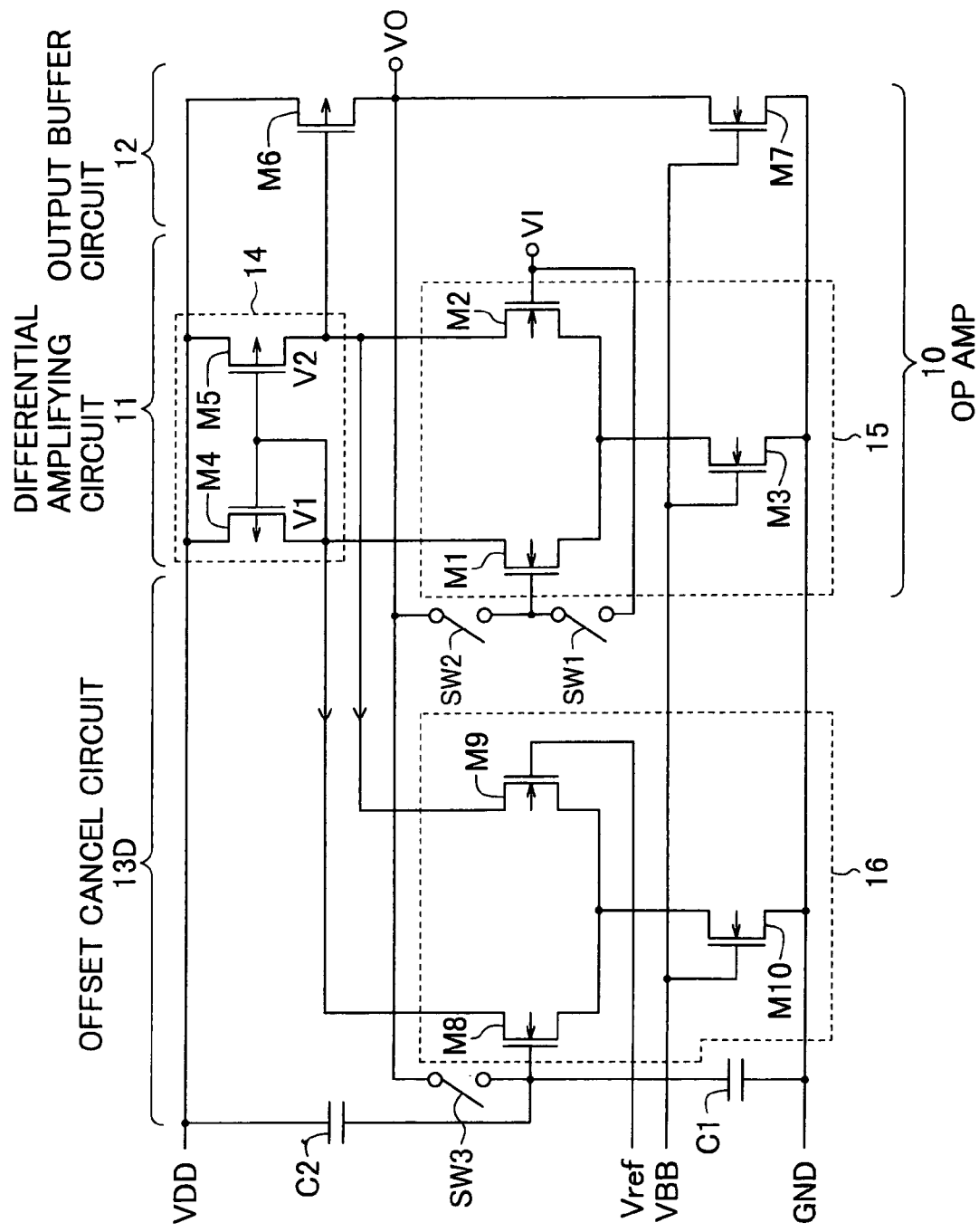
FIG. 5 is a circuit diagram showing still another modification of the voltage follower with offset-cancel of FIG. 1.

FIG. 5 is a circuit diagram showing still another modification of the voltage follower with offset-cancel of FIG. 1.

Differently from the circuit of FIG. 1, this circuit further includes a capacitor C2 connected between the power supply potential VDD and the gate of the NMOS transistor M8. According to this circuit, for example, in a case where ground GND varies with the power supply potential VDD being constant, the capacitor C2 reduces the influence of the variation.

Second Embodiment

Figure 6:
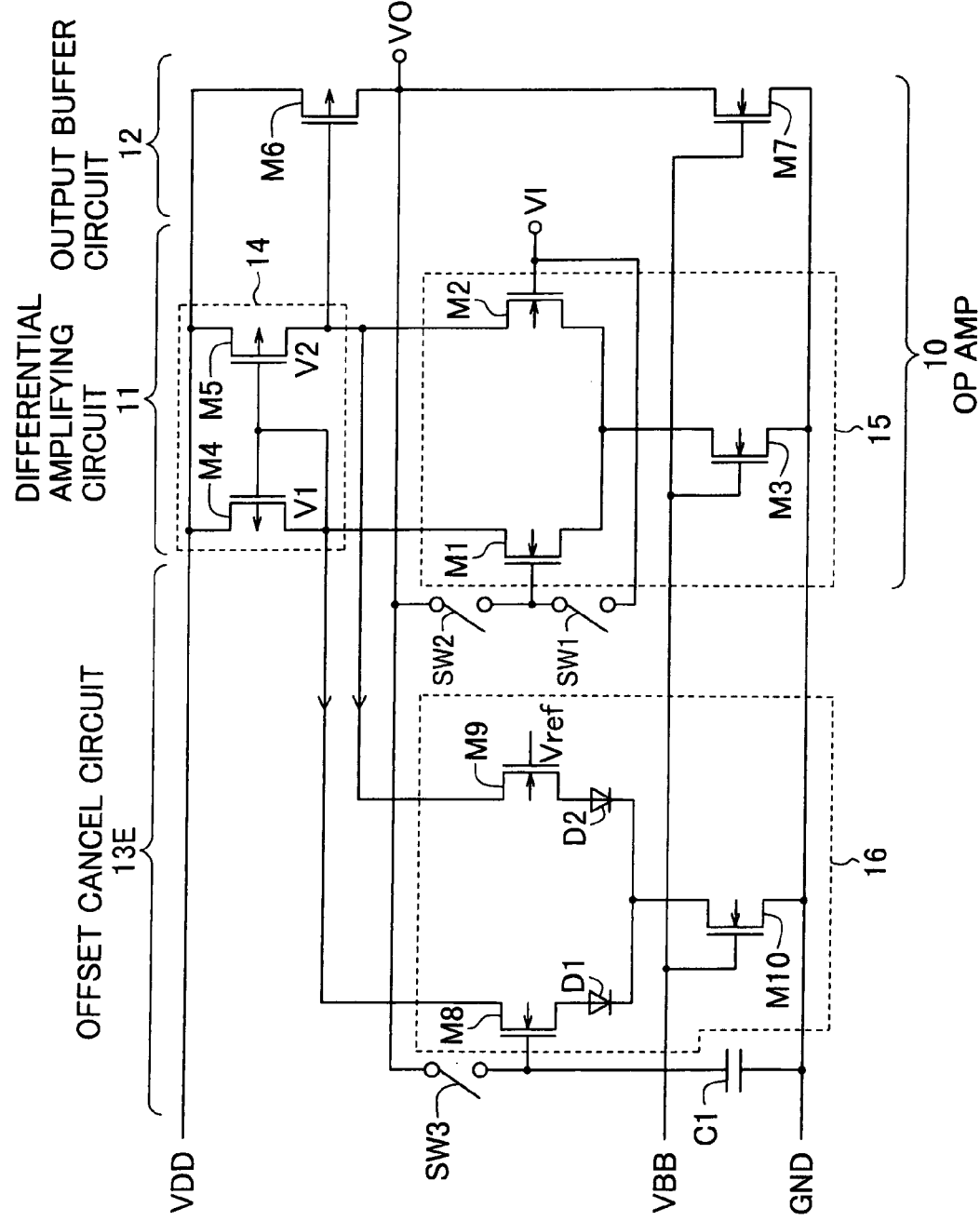
FIG. 6 is a circuit diagram showing a voltage follower with offset-cancel according to a second embodiment of the present invention.

FIG. 6 is a circuit diagram showing a voltage follower with offset-cancel according to a second embodiment of the present invention.

This circuit differs from the circuit of FIG. 1 in that diodes D1 and D2 for preventing an adverse current are connected between the source of the NMOS transistor M9 and the drain of the NMOS transistor M10 and between the source of the NMOS transistor M8 and the drain of the NMOS transistor M10, respectively. Each of the diodes D1 and D2 may be replaced with a diode-connected MOS transistor.

Figure 7:
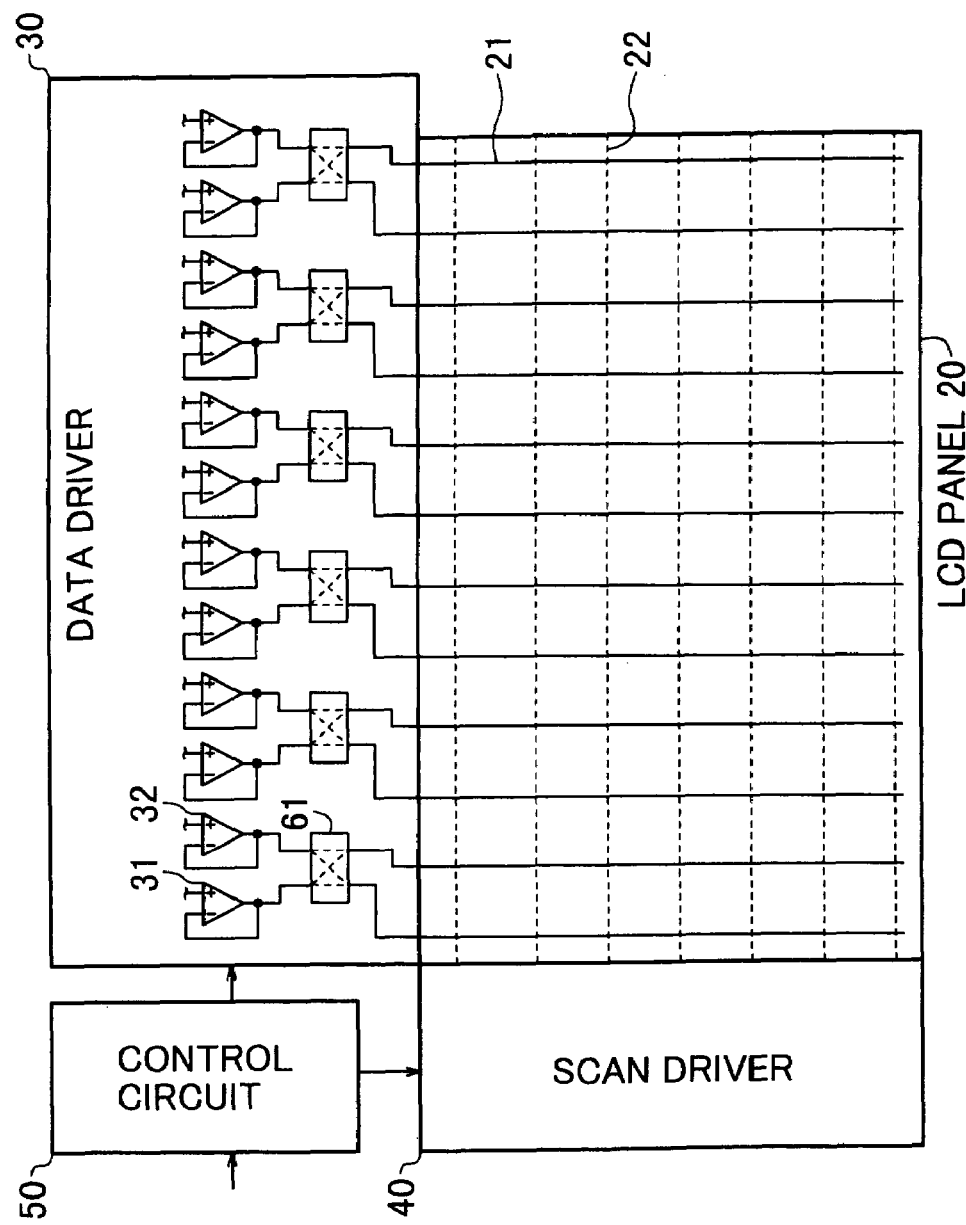
FIG. 7 is a schematic diagram of a liquid crystal display device in which any one of the circuits of FIGS. 1 and 3 to 6 is employed for its data driver.

FIG. 7 shows a schematic configuration of a liquid crystal display device in which any kind of the circuits of FIGS. 1 and 3 to 6 is employed for a data driver.

In a LCD panel 20, a plurality of vertically extended data lines 21 and a plurality of horizontally extended scan lines 22 are formed crossing over each other, and a pixel is formed at each crossover point. One ends of the data lines 21 and the scan lines 22 are connected to a data driver 30 and a scan driver 40, respectively. Based on a video signal, a pixel clock signal, a horizontal synchronous signal, and a vertical synchronous signal provided from the external, a control circuit 50 provides a display data signal and a clock signal to the data driver 30, and scan control signals to the scan driver 40. The data driver 30 converts the display data to positive and negative potentials with respect to ground GND every horizontal scan period (and every pixel) as well-known in the art.

The data driver 30 includes in its output stage a positive-polarity voltage follower with offset-cancel 31, a negative-polarity voltage follower with offset-cancel 32, . . . . Each pair of neighboring positive and negative-polarity voltage followers each with offset-cancel are connected to adjacent data line pair of the LCD panel 20 through a switching circuit 61 for selectively parallel or crossover connection. The positive-polarity voltage follower with offset-cancel 31 has the same structure as any one of the circuits of FIGS. 1, and 3 to 6, and the negative-polarity voltage follower with offset-cancel 32 has such a structure that NMOS and PMOS transistors are interchanged with respective PMOS and NMOS transistors in any one of the circuits of FIGS. 1, and 3 to 6.

Although preferred embodiments of the present invention have been described, it is to be understood that the invention is not limited thereto and that various changes and modifications may be made without departing from the spirit and scope of the invention. At the time of turning over in the switching circuit 61, the output potential of the voltage follower with offset-cancel 31 sharply falls in a moment. This causes, in the circuit of FIG. 1, the current flowing through the NMOS transistor M8 to partially flow into the NMOS transistor M9, requiring a marginal time until stabilizing this operation. However, the circuit of FIG. 6 prevents this adverse current, securing the time required to drive liquid crystal pixels.

Although preferred embodiments of the present invention have been described, it is to be understood that the invention is not limited thereto and that various changes and modifications may be made without departing from the spirit and scope of the invention.

For example, the present invention may employ such switches connected to the respective NMOS transistors M8 and M9 in series instead of the diodes D1 and D2 that the adverse current can be avoided by turning off the switches during a time from right before to right after the sharply falling of the output potential VO. Further, the present invention may include such a structure that currents flowing through the NMOS transistors M10, M3, and M7 serving as a constant current source can be stabilized by adjusting the bias potential VBB against variations in the power supply potential VDD or ground GND.

What is claimed is:

1. A data driver for a liquid crystal display device, the data driver including a plurality of voltage followers coupled to a plurality of data lines of the liquid crystal display device, each voltage follower comprising:
   a current mirror circuit having first and second current ends as a pair of differential potential outputs;
   a first differential input circuit including first and second transistors, the first transistor having a current-path whose one end is connected to the first current end and having a gate, the second transistor having a current-path whose one end is connected to the second current end and having a gate receiving a input signal;
   an output buffer circuit having an output for providing a signal according to a potential at the second current end, the output being coupled to one of the plurality of data lines;
   a second differential input circuit including third and fourth transistors, the third transistor having a current-path whose one end is connected to the first current end and having a gate, the fourth transistor having a current-path whose one end is connected to the second current end and having a gate receiving a reference potential;
   a first switch connected between the gate of the first transistor and the gate of the second transistor;
   a second switch connected between the output and the gate of the first transistor, the second switch being on/off-controlled adversely to the first switch;
   a third switch connected between the output and the gate of the third transistor, the third switch being on/off-controlled in gang with the first switch; and
   a capacitor connected between the gate of the third transistor and a predetermined potential.

2. The data driver according to claim 1, wherein the first differential input circuit further comprises:
   a constant current source;
   a first diode, connected between the constant current source and another end of the current-path of the first transistor, for preventing a backflow; and
   a second diode, connected between the constant current source and another end of the current-path of the second transistor, for preventing a backflow.

3. The data driver according to claim 1, wherein the predetermined potential is equal to the reference potential.

4. The data driver according to claim 1, wherein the reference potential is substantially equal to a central potential in an operation range of an input signal provided to the non-inverting input.

5. The data driver according to claim 1, wherein the reference potential is substantially equal to a mean value of a maximum value and a minimum value in a gray-scale potential range of a liquid crystal display panel.

6. A liquid crystal display device, comprising:
   a liquid crystal display panel including a plurality of data lines; and
   the data driver including a plurality of voltage followers coupled to the plurality of data lines,
   wherein each voltage follower comprises:
   a current mirror circuit having first and second current ends as a pair of differential potential outputs;
   a first differential input circuit including first and second transistors, the first transistor having a current-path whose one end is connected to the first current end and having a gate, the second transistor having a current-path whose one end is connected to the second current end and having a gate receiving a input signal;
   an output buffer circuit having an output for providing a signal according to a potential at the second current end, the output being coupled to one of the plurality of data lines;
   a second differential input circuit including third and fourth transistors, the third transistor having a current-path whose one end is connected to the first current end and having a gate, the fourth transistor having a current-path whose one end is connected to the second current end and having a gate receiving a reference potential;
   a first switch connected between the gate of the first transistor and the gate of the second transistor;
   a second switch connected between the output and the gate of the first transistor, the second switch being on/off-controlled adversely to the first switch;
   a third switch connected between the output and the gate of the third transistor, the third switch being on/off-controlled in gang with the first switch; and
   a capacitor connected between the gate of the third transistor and a predetermined potential.

* * * * *